United States Patent
Roohparvar

(10) Patent No.: US 7,573,738 B2
(45) Date of Patent: *Aug. 11, 2009

(54) MODE SELECTION IN A FLASH MEMORY DEVICE

(75) Inventor: Frankie F. Roohparvar, Milpitas, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/746,913

(22) Filed: May 10, 2007

(65) Prior Publication Data

US 2007/0206420 A1    Sep. 6, 2007

Related U.S. Application Data

(63) Continuation of application No. 10/987,809, filed on Nov. 12, 2004, now Pat. No. 7,227,777, which is a continuation of application No. 10/301,409, filed on Nov. 21, 2002, now Pat. No. 6,836,434.

(51) Int. Cl.
    *G11C 11/34* (2006.01)
(52) U.S. Cl. .................. 365/185.01; 365/185.11; 365/185.12
(58) Field of Classification Search .......... 365/185.01, 365/185.11, 233, 189.05, 189.12, 185.12, 365/185.33, 185.17
    See application file for complete search history.

(56) References Cited

U.S. PATENT DOCUMENTS

| | | | |
|---|---|---|---|
| 5,287,470 A * | 2/1994 | Simpson | 345/540 |
| 5,570,320 A | 10/1996 | Runas | |
| 5,774,397 A * | 6/1998 | Endoh et al. | 365/185.19 |
| 5,787,038 A | 7/1998 | Park | |
| 5,835,414 A | 11/1998 | Hung | |
| 5,896,395 A * | 4/1999 | Lee | 714/718 |
| 5,986,933 A * | 11/1999 | Takeuchi et al. | 365/185.12 |
| 6,118,705 A | 9/2000 | Gupta | |
| 6,128,675 A | 10/2000 | Ko | |
| 6,215,725 B1 * | 4/2001 | Komatsu | 365/233 |
| 6,222,767 B1 | 4/2001 | Kendall et al. | |
| 6,259,645 B1 | 7/2001 | Chen et al. | |
| 6,381,180 B1 * | 4/2002 | Merritt et al. | 365/189.05 |
| 6,381,670 B1 | 4/2002 | Lee et al. | |
| 6,433,714 B1 * | 8/2002 | Clapp et al. | 341/121 |
| 6,442,068 B1 | 8/2002 | Bartoli et al. | |
| 6,691,219 B2 | 2/2004 | Ma et al. | |
| 6,836,434 B2 | 12/2004 | Roohparvar | |
| 2002/0122347 A1 | 9/2002 | Frulio et al. | |
| 2003/0026133 A1 | 2/2003 | Oron et al. | |
| 2003/0031076 A1 | 2/2003 | Widmer et al. | |

* cited by examiner

*Primary Examiner*—Dang T Nguyen
(74) *Attorney, Agent, or Firm*—Leffert Jay & Polglaze, P.A.

(57) ABSTRACT

A single flash memory device has selectable read modes for either a segment mode or a page mode. The desired mode is selected by writing a control word to a mode control register. Selecting the segment mode causes the device to output selected memory segments. Selecting the page mode causes the device to output selected memory pages.

16 Claims, 4 Drawing Sheets

MODE SELECTION IN A FLASH MEMORY DEVICE

CROSS-REFERENCE TO RELATED APPLICATION

This application is a Continuation of U.S. patent application Ser. No. 10/987,809, filed Nov. 12, 2004, now U.S. Pat. No. 7,227,777 and titled, "MODE SELECTION IN A FLASH MEMORY DEVICE," which is a Continuation of U.S. patent application Ser. No. 10/301,409, filed Nov. 21, 2002, now U.S. Pat. No. 6,836,434, issued Dec. 28, 2004, and titled, "MODE SELECTION IN A FLASH MEMORY DEVICE," which is commonly assigned and incorporated by reference in its entirety herein.

TECHNICAL FIELD OF THE INVENTION

The present invention relates generally to memory devices and particularly to flash memory devices.

DESCRIPTION OF THE RELATED ART

Flash memory devices have developed into a popular source of non-volatile memory for a wide range of electronic applications. Flash memory devices typically use a one-transistor memory cell that allows for high memory densities, high reliability, and low power consumption. Common uses for flash memory include portable computers, personal digital assistants (PDAs), digital cameras, and cellular telephones. Program code, system data such as a basic input/output system (BIOS), and other firmware can typically be stored in flash memory devices.

A synchronous flash memory device is a type of flash memory device that has a synchronous dynamic random access memory (SDRAM) interface for read operations. This enables the synchronous flash memory device to operate at much higher speeds than a typical flash memory by opening a page (i.e., a row) of 8000 bits at one time. This increases the synchronous flash device's performance at the expense of higher current usage.

FIG. 1 illustrates a simplified block diagram of a typical prior art synchronous flash memory array (100) architecture. The memory array (100) generally consists of a number of memory array banks (102, 104, 106, 108) that have rows (110) and columns (112). A memory bank (102, 104, 106, 108), upon being accessed with a bank, row, and column address, loads an internal data latch circuit (114) with a defined number of bits.

When a bank and row are selected by an input row address, the contents of the row of memory cells are placed on column bit lines coupled to sense amplifiers that are located in the latch circuitry block (114). The values detected by the sense amplifiers are latched into the latch circuitry (114). An input column address, that defines the column page, selects from the latches of the latch circuitry (114) and, thus, from the columns of the active row page.

To encompass a large variety of applications, chip designers make some restrictive choices in the characteristics of memory designs. These characteristics include current consumption and performance. The designers typically have to trade off one for the other since the faster the memory device, the higher the current consumption. For example, an electronic circuit that requires the speed of the synchronous flash has to live with relatively high current consumption as well. Whereas an electronic circuit that has the low current consumption of the virtual synchronous flash may sacrifice its performance somewhat.

Battery powered devices would benefit more from low power consumption than higher performance. Line powered devices would benefit more from faster performance than low power consumption. In order to satisfy both markets, flash memory designers typically have to design multiple versions of a memory. This requires more time and money on the part of the manufacturer. There is a resulting need in the art for a way to choose power consumption versus throughput in a single flash memory device.

DETAILED DESCRIPTION

The embodiments of the memory device of the present invention provide a flash memory device that is selectable to perform a read operation in either a page mode or a page segment mode. This is accomplished by writing a predetermined command word or bit to a mode register to enable the desired type of flash memory device characteristics for a particular electronic design.

Figure 1:
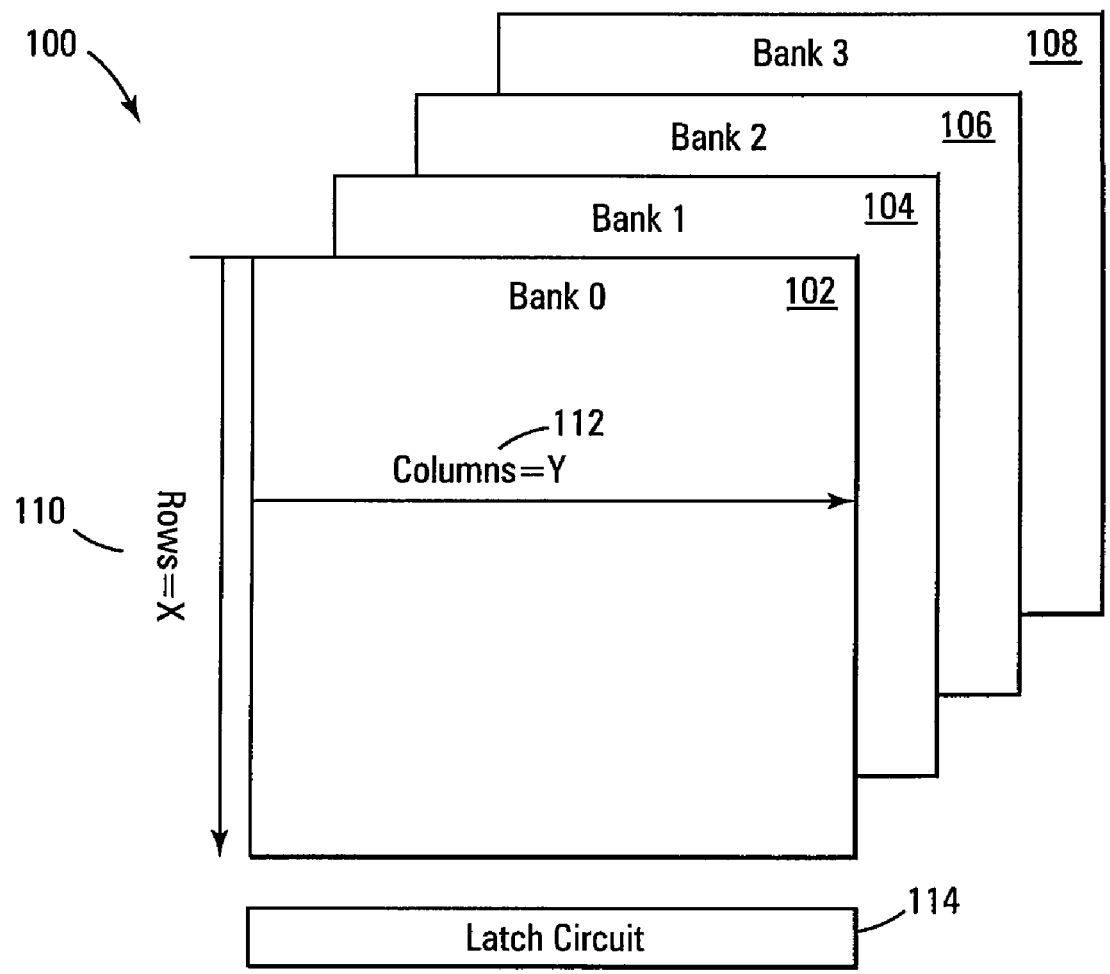
FIG. 1 shows a simplified block diagram of a typical prior art synchronous flash memory array architecture
Figure 2:
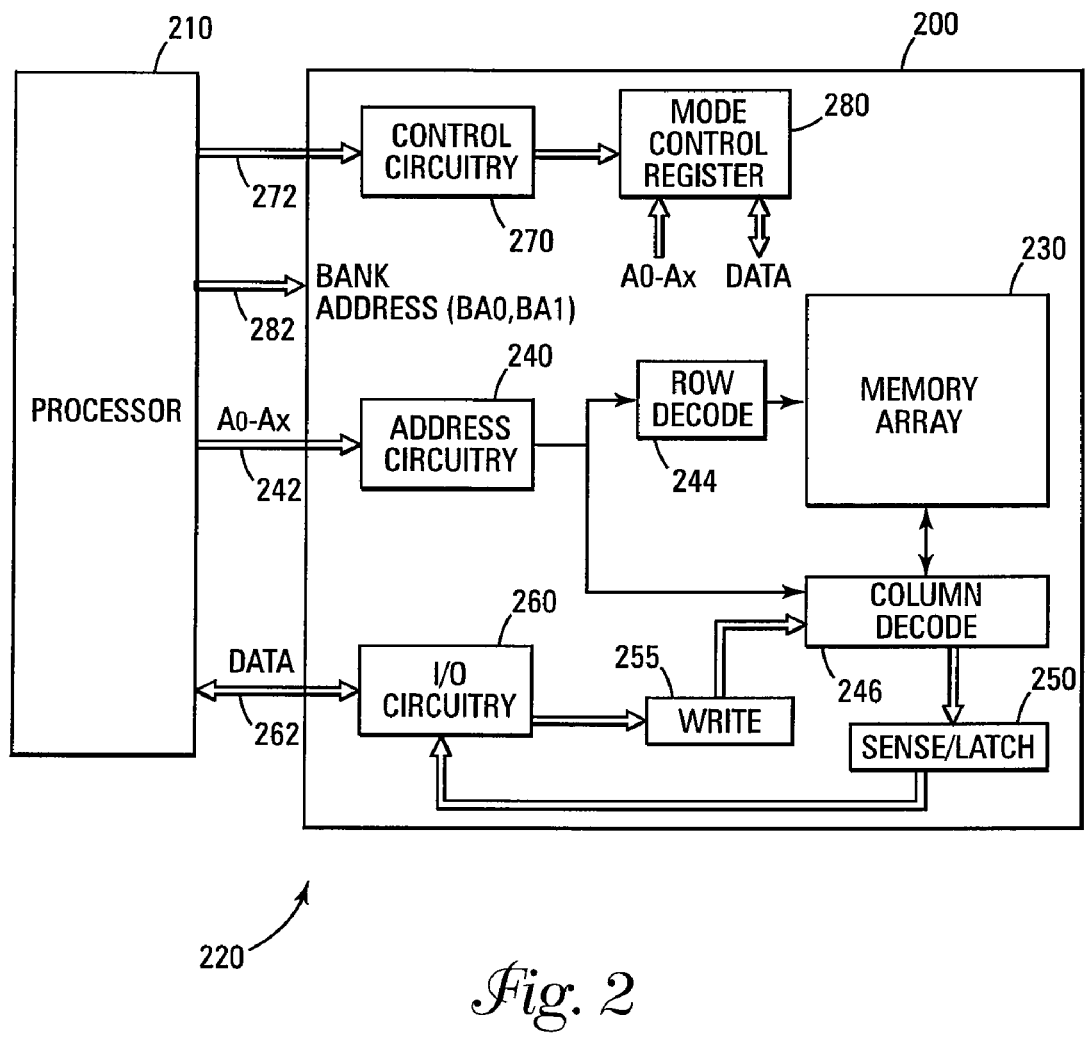
FIG. 2 shows a block diagram of one embodiment of a memory system of the present invention.

FIG. 2 is a functional block diagram of a flash memory device (200) of one embodiment of the present invention that is coupled to a processor (210). The flash memory device (200) and the processor (210) may form part of an electronic system (220). The flash memory device (200) has been simplified to focus on features of the memory that are helpful in understanding the present invention. The flash memory device is selectable, through the control registers, to have the attributes of either a synchronous flash memory device that is read in a page mode or a synchronous flash memory device that is read in a page segment/portion mode.

The flash memory device includes an array of memory cells (230). The memory cells are non volatile floating gate memory cells. The memory array (230) is arranged in banks of rows and columns.

An address buffer circuit (240) is provided to latch address signals provided on address input connections A0 Ax (242). Address signals are received and decoded by a row decoder (244) and a column decoder (246) to access the memory array (230). It will be appreciated by those skilled in the art, with the benefit of the present description, that the number of address input connections depends on the density and architecture of the memory array (230). That is, the number of addresses increases with both increased memory cell counts and increased bank and block counts.

Additional bank address lines (282) are used to access the different banks of the memory array (230). In one embodiment of the present invention, there are four memory banks. In such an embodiment, two bank address lines, BA1 and BA0, are required to activate each memory bank. For example, if memory bank 3 is desired to be activated, from memory banks 0, 1, 2, and 3, then BA1=1 and BA0=1. If a memory embodiment has different quantities of memory banks, different quantities of bank select lines may be required.

The flash memory device (200) reads data in the memory array (230) by sensing voltage or current changes in the memory array columns using sense/latch circuitry (250). The sense/latch circuitry, in one embodiment, is coupled to latch a row of data from the memory array (230). Data input and output buffer circuitry (260) is included for bi directional data communication over a plurality of data (DQ) connections (262) with the processor (210). Write circuitry (255) is provided to write data to the memory array.

A mode control register (280) stores a mode control word of the present invention. The mode control register (280) may be comprised of additional control registers that are used for typical control functions and others are reserved for expansion and/or future use.

In one embodiment, the mode control register (280) is comprised of flash memory cells or fuses and can be programmed only once, such as at the manufacturer. In such an embodiment, a customer may not be able to reprogram the flash memory device but the manufacturer can still reduce the number of parts it has to design by having both functions in one integrated circuit. In alternate embodiments, the mode control register can be programmed by the customer only once or reprogrammed multiple times depending on the flash memory device characteristics desired.

A command control circuit (270) decodes signals provided on control connections (272) from the processor (210). In one embodiment, the control circuit (270) is comprised of a state machine that executes the functions of the memory array (230), including data read, data write, and erase operations. The state machine may also be responsible for executing the read functions required for either the page mode or the page segment mode, depending on the control word.

In the embodiment illustrated in FIG. 2, the processor (210) generates the address, data, and control lines to the memory device (200). Alternate embodiments may use other controllers to generate these signals in an electronic system (220). Additionally, the memory device (200) may be coupled to something other than a controller or processor that generates the address, data, and control signals.

The flash memory device illustrated in FIG. 2 has been simplified to facilitate a basic understanding of the features of the memory. A more detailed understanding of internal circuitry and functions of flash memories are known to those skilled in the art.

Figure 3:
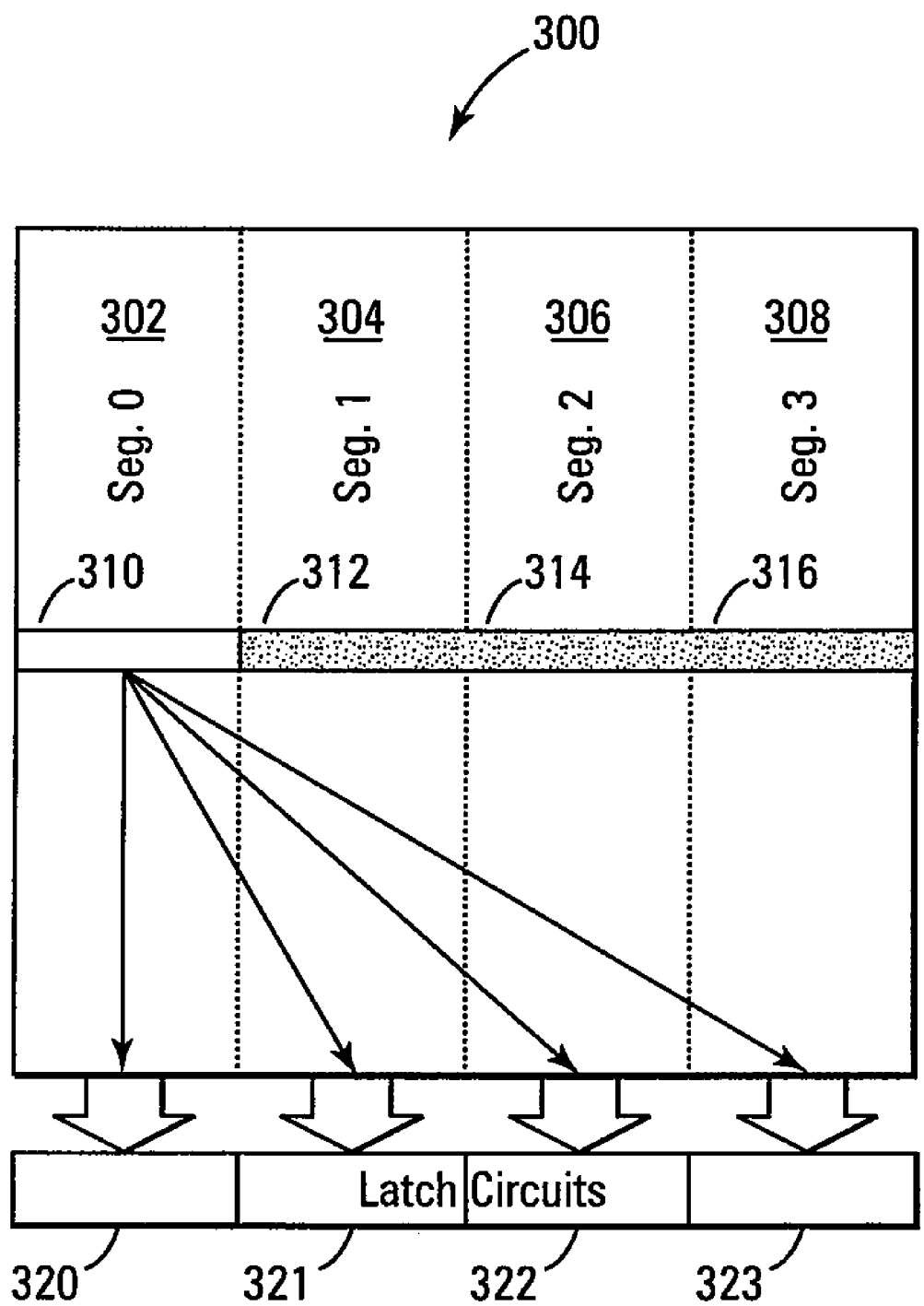
FIG. 3 shows an operation of memory segment association of one embodiment of the present invention of a synchronous flash memory device having a segment read mode.

FIG. 3 illustrates one embodiment of segment addressing in a flash memory device of the present invention. FIG. 3 shows a memory bank (300) of a synchronous flash memory with four segments (302, 304, 306, and 308) that has been logically re-mapped to an SDRAM configuration. A row of the segment zero (310) is shown being logically repositioned by an access that includes an extended synchronous flash segment address, discussed subsequently, to appear as if it was placed in one of the other three segments of the current memory bank (segment one 312, segment two 314, or segment three 316). The ability of full segment association allows any row selected in a bank to be addressed to any of the four sense amplifier/latch segments (320-323) in that bank. This has the effect of logically shifting the address space by that number of segments for a subsequent memory access.

Using the above-described segment association, the memory device only activates 2000 sense amplifiers versus 8000 sense amplifiers for an SDRAM or page mode synchronous flash memory device. In addition, because sixteen segments (i.e., 4 banks with 4 segments each) are available for the virtual synchronous flash memory device versus four segments for an SDRAM, when each of the four banks has their respective four segments activated, there is a higher hit rate for read operations without activating new rows. The increased granularity of a segment mode flash memory device decreases power usage and, in addition, decreases memory access latency. This effectively increases bandwidth from the segment mode synchronous flash device over that of a conventional page mode synchronous flash memory device.

The various memory segments (302, 304, 306, and 308) of the memory bank (300) illustrated in FIG. 3 are selected by two of the address lines that are coupled to the memory device. In one embodiment, address lines A14 and A15 select which of the four segments (302, 304, 306, and 308) of the currently active memory bank (300) are required for a particular operation.

As an example of operation, assume an operation requires access to segment 3 (308) of memory bank 2. Memory bank 2 is activated by BA1=1 and BA0=0. The particular segment 3 is selected by A14=1 and A15=1.

Alternate embodiments may use different address lines to select a particular segment. For example, larger memory devices may require A0-A15 for memory addressing. In this case, address lines A16 and A17 may be used for segment addressing.

For purposes of clarity, FIG. 3 illustrates only one bank of a virtual synchronous flash memory device of the present invention. Alternate embodiments have multiple banks of memory cells that make up the memory array. Also, even though the embodiment of FIG. 3 shows four memory segments, the present invention is not limited to any one quantity of memory segments.

As an example of operation with reference to FIGS. 2 and 3, address values for the flash memory (200) are received from the processor (210) on the external address bus connections (242) and bank address lines (282). The received address values are stored internal to the flash memory device (200) and used to select the memory cells in the internal memory array (230). In a conventional SDRAM compatible operation, the processor (210) inputs a row and bank address on address lines A0-A11 (242) and bank address lines BA0 and BA1 (282) thus activating an internal virtual row page (not shown) in the flash memory device (200).

The row and bank address is followed by a "read" command with a column address placed on address lines A0-A8 (a subset of address lines A0-Ax (242)) by the processor (210). Internal to the flash memory device (200), data values from the bank segments (not shown) are captured in the latch circuits (250), logically re-mapped to form an SDRAM compatible data format, and readied for transfer from the flash memory device (200).

Data transfer from the flash memory device (200) begins on the following clock cycle and is transmitted on the bidirectional data word interface (262) to the processor (210). Control of the flash memory device (200) for operations is actuated by the internal control circuitry (270). The control circuitry (270) operates in response to external control signals (272) received from the processor (210) on control signal external interface connections (272) and to internal events.

Extended access to the flash memory device (200), when the device is operating with segment mode characteristics, is accomplished utilizing the extended synchronous Flash address lines, A12-A15 (a subset of A0-Ax (242)). The processor (210), with an "active" command, inputs a row on address lines A0-A11 (242), extended row and segment address lines A12-A15 (242), and bank address lines BA0 and BA1 (282). The "active" command directly activates a bank and internal row page and/or segment of the internal memory array (230) in the flash memory device (200) for further operations.

The row, extended row, and bank address are followed by a "read" command with a column address placed on address lines A0-A8 (a subset of address lines A0-Ax (242)) by the processor (210). If the memory device is operating with segment mode characteristics, data values from the bank segments (not shown) are readied for transfer from the synchronous flash memory device (200) by being copied into the internal latch circuits (250) as illustrated in FIG. 3.

Data transfers from or to the flash memory device (200) begin on the following clock cycle received and are transmitted on the bidirectional data word interface (262) to the processor (210). Control of the flash memory device (200) for operations is actuated by the internal control circuitry (270). The control circuitry (270) operates in response external control signals received from the processor (210) on control signal external interface connections (272) and to internal events.

Figure 4:
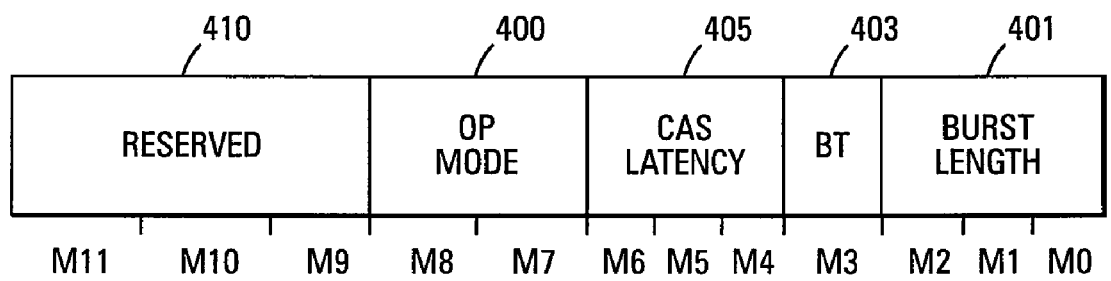
FIG. 4 shows formatting of one embodiment of a mode register of the present invention.

FIG. 4 illustrates one embodiment of a mode register of the present invention. Writing a command word to one of possibly multiple locations of the mode control register (i.e., 280 in FIG. 2) sets the operating mode of the memory device.

As one example of operation, the illustrated register format of the mode control register of FIG. 4 enables the burst length (401) to be set by bits M0-M2. As is well known in the art, the burst length determines the maximum number of column locations that can be accessed for a given read or write command.

Bit M3 (403) sets the burst type. In one embodiment, the burst type might be sequential while another embodiment chooses the burst type to be interleaved.

The CAS latency is chosen by bits M4-M6 (405). CAS latency is the delay, in clock cycles, between registration of a read command and the availability of the first output of data. In this embodiment, the latency can be set to one, two, or three clock cycles.

The operating mode of the memory device is set by bits M7 and M8 (400). These bits (400) determine the memory device's characteristics. In one embodiment, M7=0 and M8=1 set the memory device's characteristics to be that of a segment mode synchronous flash memory device. If M7=1 and M8=0, the memory device has the characteristics of a page mode synchronous flash memory device. An alternate embodiment reverses the values of these bits to select the desired device characteristics. Still another embodiment uses different values and/or different bit locations in the mode control register to select the device characteristics.

Bits M9-M11 (410), in one embodiment, are reserved. These bits may be reassigned for other memory functions in other embodiments of the memory device.

The format of the mode register illustrated in FIG. 4 is for purposes of illustration only. The device type bit can be located in any location of the mode register. In one embodiment, the device type bit is in a different location of the mode register than the other selectable functions that are initialized in this register. In such an embodiment, the mode is selected by writing a logical 1 or 0 in the appropriate bit location of the register.

In one embodiment, the page mode synchronous flash memory functions and the segment mode flash memory functions share substantially the same functional circuitry. Alternate embodiments use separate circuitry on a single integrated circuit for each function.

CONCLUSION

In summary, the embodiments of the present invention enable an integrated circuit manufacturer to reduce the quantity of parts necessary to support both high performance and low power flash memory devices. This is accomplished by incorporating both page mode synchronous flash memory and segment mode synchronous flash memory characteristics into one integrated circuit. These characteristics are then user selectable by initializing the mode control register with the proper control word.

Numerous modifications and variations of the present invention are possible in light of the above teachings. It is therefore to be understood that within the scope of the appended claims, the invention may be practiced otherwise than as specifically described herein.

What is claimed is:

1. A memory device comprising:
   an array of memory cells; and
   control circuitry, coupled to the array of memory cells, wherein the control circuitry is adapted to operate in a plurality of read modes each mode selectable by a received read mode control command, the read modes comprising:
   a page read mode; and
   a page segment read mode, wherein the page segment read mode reads a segment of memory cells comprising a subset of memory cells read during the page read mode;
   wherein the control circuitry comprises a plurality of sense amplifiers, arranged into segments and coupled to a plurality of latch circuits such that a segment of memory read during the page segment read mode can be associated with any one segment of the plurality of sense amplifiers.

2. The memory device of claim 1 wherein the control circuitry is further comprised of a mode control register.

3. The memory device of claim 2 wherein the mode control register is comprised of memory cells.

4. The memory device of claim 3 wherein the memory cells comprising the mode control register are flash memory cells.

5. The memory device of claim 2 wherein the mode control register is comprised of fuses capable of being programmed only once.

6. The memory device of claim 2 wherein the mode control register comprises a plurality of registers, the plurality of registers storing data wherein the data indicates an intended operating mode of the memory device.

7. The memory device of claim 6 wherein a subset of the plurality of registers is reserved for expansion or future use in the memory device.

8. The memory device of claim 1 wherein the control circuitry is further comprised of a command control circuit.

9. The memory device of claim 8 wherein the command control circuitry is responsible for executing the page read mode and page segment read mode operations of the memory device.

10. The memory device of claim 1 wherein the received read mode control command comprises bits indicating intended burst length, burst type, CAS latency and intended read mode.

11. A memory device comprising:
    an array of memory cells, the memory cells arranged in rows and columns;
    an interface adapted to receive operating mode command signals; and
    control circuitry, coupled to the interface, for selectively operating the memory device in a plurality of modes that are each selectable by the received mode command signals, the modes comprising:
    a synchronous page read mode; and a synchronous page segment read mode, wherein the synchronous page segment read mode comprises reading a subset of the array of memory cells read during the synchronous page read mode operation;

wherein the control circuitry comprises a plurality of sense amplifiers, arranged into segments and coupled to a plurality of latch circuits such that a segment of memory read during the synchronous page segment read mode can be repositioned to any one segment of the plurality of sense amplifiers.

12. A method of reading an array of memory cells, the memory cells coupled to control circuitry for carrying out operations of the memory array, the control circuitry comprising a plurality of sense amplifiers, organized into segments, for reading data stored in the memory cells, the method comprising:

receiving a read mode command, the read mode command indicating a page read mode command or a page segment read mode command;

reading a page of memory cells selected by the received page read mode command;

reading a segment of a page of memory cells selected by the received page segment read mode command and repositioning the read segment of the page of memory cells to any one of the sense amplifier segments.

13. The method of claim 12 wherein the control circuitry comprises additional circuitry adapted to perform a page read mode operation in response to a received page read mode command.

14. The method of claim 12 wherein the control circuitry comprises circuitry adapted to perform a page segment read mode operation in response to a received page segment read mode command.

15. The method of claim 12 wherein a page segment read mode operation comprises reading a segment of memory cells comprising a subset of memory cells read during a page read mode operation.

16. The method of claim 12 wherein the control circuitry for carrying out operations of the memory array is implemented in whole or in part by a state machine.

* * * * *